(12) United States Patent
Consiglio et al.

(10) Patent No.: US 9,899,224 B2
(45) Date of Patent: Feb. 20, 2018

(54) METHOD OF CONTROLLING SOLID PHASE DIFFUSION OF BORON DOPANTS TO FORM ULTRA-SHALLOW DOPING REGIONS

(71) Applicant: Tokyo Electron Limited, Minato-ku, Tokyo (JP)

(72) Inventors: Steven P. Consiglio, Albany, NY (US); Robert D. Clark, Livermore, CA (US); David L. O'Meara, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/055,920

(22) Filed: Feb. 29, 2016

(65) Prior Publication Data
US 2016/0260611 A1    Sep. 8, 2016

Related U.S. Application Data

(60) Provisional application No. 62/127,690, filed on Mar. 3, 2015.

(51) Int. Cl.
*H01L 21/225* (2006.01)
*H01L 21/02* (2006.01)
*H01L 29/66* (2006.01)

(52) U.S. Cl.
CPC ...... *H01L 21/2256* (2013.01); *H01L 21/2254* (2013.01); *H01L 21/0228* (2013.01); *H01L 21/02112* (2013.01); *H01L 29/66803* (2013.01)

(58) Field of Classification Search
CPC ............. H01L 21/2256; H01L 21/2254; H01L 21/02112
See application file for complete search history.

(56) References Cited

U.S. PATENT DOCUMENTS

| | | |
|---|---|---|
| 5,281,552 A | 1/1994 | King et al. |
| 5,407,847 A | 4/1995 | Hayden et al. |
| (Continued) | | |

FOREIGN PATENT DOCUMENTS

| | | |
|---|---|---|
| TW | 201308401 A1 | 2/2013 |
| WO | WO 01/11668 A1 | 2/2001 |

OTHER PUBLICATIONS

Taiwan International Patent Office, Notification of Examination Opinions for corresponding TW patent application No. 05106230, dated Feb. 23, 2017, 14 pages.

(Continued)

*Primary Examiner* — Amar Movva

(57) ABSTRACT

A method is provided for forming an ultra-shallow boron doping region in a semiconductor device. The method includes depositing a diffusion filter layer on a substrate, the diffusion filter containing a boron nitride layer, a boron oxynitride layer, a silicon nitride layer, or a silicon oxynitride layer, and depositing a boron dopant layer on the diffusion filter layer, the boron dopant layer containing boron oxide, boron oxynitride, or a combination thereof, with the proviso that the diffusion filter layer and the boron dopant layer do not contain the same material. The method further includes heat-treating the substrate to form the ultra-shallow boron dopant region in the substrate by controlled diffusion of boron from the boron dopant layer through the diffusion filter layer and into the substrate.

20 Claims, 6 Drawing Sheets

(56) References Cited

U.S. PATENT DOCUMENTS

| | | | |
|---|---|---|---|
| 5,478,776 | A | 12/1995 | Luftman et al. |
| 5,792,703 | A * | 8/1998 | Bronner ............ H01L 21/76897 |
| | | | 257/E21.507 |
| 5,998,271 | A | 12/1999 | Schwalke |
| 6,099,647 | A | 8/2000 | Yieh et al. |
| 6,150,243 | A | 11/2000 | Wieczorek et al. |
| 6,228,750 | B1 | 5/2001 | Shibib |
| 6,238,986 | B1 | 5/2001 | Kepler et al. |
| 6,372,588 | B2 | 4/2002 | Wristers et al. |
| 6,686,630 | B2 | 2/2004 | Hanafi et al. |
| 6,858,532 | B2 | 2/2005 | Natzle et al. |
| 6,905,941 | B2 | 6/2005 | Doris et al. |
| 7,041,538 | B2 | 5/2006 | Ieong et al. |
| 7,105,427 | B1 | 9/2006 | Chu et al. |
| 7,112,516 | B2 | 9/2006 | Chakravarthi et al. |
| 7,250,658 | B2 | 7/2007 | Doris et al. |
| 7,723,233 | B2 | 5/2010 | Krull et al. |
| 7,727,845 | B2 | 6/2010 | Wang et al. |
| 7,935,591 | B2 | 5/2011 | Rouh et al. |
| 8,288,292 | B2 | 10/2012 | Antonelli et al. |
| 8,580,664 | B2 | 11/2013 | Clark |
| 8,610,201 | B1 | 12/2013 | Hokazono |
| 2003/0067037 | A1 | 4/2003 | Lu et al. |
| 2004/0191998 | A1 | 9/2004 | Natzle et al. |
| 2005/0059259 | A1 * | 3/2005 | O'Meara ............ H01L 21/02181 |
| | | | 438/765 |
| 2005/0260347 | A1 | 11/2005 | Narwankar et al. |
| 2006/0014396 | A1 | 1/2006 | Chen et al. |
| 2006/0063346 | A1 | 3/2006 | Lee et al. |
| 2006/0194435 | A1 | 8/2006 | Nishimura et al. |
| 2006/0237791 | A1 | 10/2006 | Doris et al. |
| 2008/0224273 | A1 | 9/2008 | America et al. |
| 2008/0254606 | A1 | 10/2008 | Baek et al. |
| 2008/0315293 | A1 | 12/2008 | Ji et al. |
| 2008/0315295 | A1 | 12/2008 | Ji et al. |
| 2010/0048005 | A1 | 2/2010 | Seebauer |
| 2010/0240172 | A1 | 9/2010 | Rana et al. |
| 2011/0108920 | A1 | 5/2011 | Basker et al. |
| 2011/0129990 | A1 | 6/2011 | Mandrekar et al. |
| 2011/0159673 | A1 | 6/2011 | Hanawa et al. |
| 2011/0269287 | A1 | 11/2011 | Tsai et al. |
| 2012/0187539 | A1 * | 7/2012 | De Souza ............ H01L 21/2256 |
| | | | 257/607 |
| 2012/0252197 | A1 * | 10/2012 | Clark .................. H01L 21/2254 |
| | | | 438/559 |
| 2012/0168613 | A1 | 12/2012 | Yu et al. |

OTHER PUBLICATIONS

Kalkofen et al. "Atomic layer deposition of boron oxide as dopant source for shallow doping of silicon", 217th Electrochemical Society Meeting Abstract #943, Vancouver, Canada, Apr. 25-30, 2010, 1 page.

Ho et al. "Wafer-Scale, Sub-5 nm Junction Formation by Monolayer Doping and Conventional Spike Annealing," Nano Letter, 95 (2) (2009) 725-730.

Kalkofen et al. "P-type Doping of Silicon Suitable for Structures with High Aspect Ratios by Using a Dopant Source of Boron Oxide Grown by Atomic Layer Deposition," ECS Transactions, 45(6) 55-67 (2012).

Kim et al. "A Novel Doping Technology for Ultra-shallow Junction Fabrication: Boron diffusion from Boron-adsorbed Layer by Rapid Thermal Annealing," Thin Solid Films 369 (2000) 207-212.

Korean Intellectual Property Office, Office Action for corresponding KR patent application No. 10-2016-0025721, dated Jun. 7, 2017, 2 pages.

* cited by examiner

| ALD dopant layer | ALD dopant cycles | Capping layer | Normalized Rs (Ohms/□) |
|---|---|---|---|
| none | 0 | $Al_2O_3$ | 1.00 |
| $B_2O_3$ | 60 | $Al_2O_3$ | 0.62 |
| none | 0 | $Si_3N_4$ | 1.00 |
| BN | 40 | $Si_3N_4$ | 1.00 |
| BN | 80 | $Si_3N_4$ | 1.01 |
| BN | 120 | $Si_3N_4$ | 0.99 |

METHOD OF CONTROLLING SOLID PHASE DIFFUSION OF BORON DOPANTS TO FORM ULTRA-SHALLOW DOPING REGIONS

FIELD OF INVENTION

The present invention generally relates to semiconductor devices and methods for forming the same, and more particularly to ultra-shallow boron dopant region formation by solid phase diffusion of boron from a boron dopant layer through a diffusion filter layer into a substrate.

BACKGROUND OF THE INVENTION

The semiconductor industry is characterized by a trend toward fabricating larger and more complex circuits on a given semiconductor chip. The larger and more complex circuits are achieved by reducing the size of individual devices within the circuits and spacing the devices closer together. As the dimensions of the individual components within a device such as a metal oxide semiconductor (MOS) or bipolar transistor are reduced and the device components brought closer together, improved electrical performance can be obtained. However, attention must be given to the formation of doped regions in the substrate to insure that deleterious electrical field conditions do not arise.

As the size of device components such as the transistor gate in an MOS device and the emitter region in a bipolar device are reduced, the junction depth of doped regions formed in the semiconductor substrate must also be reduced. The formation of shallow junctions having a uniform doping profile and a high surface concentration has proven to be very difficult. A commonly used technique is to implant dopant atoms into the substrate with an ion implantation apparatus. Using ion implantation, the high energy dopant atoms bombard the surface of the substrate at high velocity and are driven into the substrate. While this method has proven effective for the formation of doped regions having moderately deep junctions, the formation of ultra-shallow junctions using ion implantation is extremely difficult. Both the path of the energized dopant atoms within the substrate and the implant uniformity are difficult to control at the low energies necessary to form shallow implanted junctions. The implantation of energized dopant atoms damages the crystal lattice in the substrate which is difficult to repair. Dislocations resulting from the lattice damage can easily spike across a shallow junction giving rise to current leakage across the junction. Moreover, the implantation of p-type dopants such as boron, which diffuse rapidly in silicon, results in excessive dispersion of dopant atoms after they are introduced into the substrate. It then becomes difficult to form a highly confined concentration of p-type dopant atoms in a specified area in the substrate and especially at the surface of the substrate.

In addition, new device structures for transistors and memory devices are being implemented that utilize doped three-dimensional structures. Examples of such devices include, but are not limited to, FinFETs, tri-gate FETs, recessed channel transistors (RCATs), and embedded dynamic random access memory (EDRAM) trenches. In order to dope these structures uniformly it is desirable to have a doping method that is conformal. Ion implant processes are effectively line of site and therefore require special substrate orientations to dope fin and trench structures uniformly. In addition, at high device densities, shadowing effects make uniform doping of fin structures extremely difficult or even impossible by ion implant techniques. Conventional plasma doping and atomic layer doping are technologies that have demonstrated conformal doping of 3-dimensional semiconductor structures, but each of these is limited in the range of dopant density and depth that can be accessed under ideal conditions.

Embodiments of the invention provide a method for forming ultra-shallow doping regions that overcomes several of these problems.

SUMMARY OF THE INVENTION

A plurality of embodiments for ultra-shallow boron dopant region formation by controlled solid phase diffusion from a boron dopant layer into a substrate is described. The dopant regions may be formed in planar substrates, in raised features on substrates, or in recessed features in substrates. In one example, an atomic layer deposition (ALD) approach may be used for a conformal doping process that is highly desirable for doping 3D structures such as FinFETs and TriGates.

According to one embodiment, a method is provided for forming ultra-shallow boron doping region in a semiconductor device. The method includes depositing a diffusion filter layer on a substrate, the diffusion filter layer containing a boron nitride layer, a boron oxynitride layer, a silicon nitride layer, or a silicon oxynitride layer, and depositing a boron dopant layer on the diffusion filter layer, where the boron dopant layer contains boron oxide, boron oxynitride, or a combination thereof, with the proviso that the diffusion filter layer and the boron dopant layer do not contain the same material. The method further includes heat-treating the substrate to form the ultra-shallow boron dopant region in the substrate by controlled diffusion of boron from the boron dopant layer through the diffusion filter layer and into the substrate.

According to some embodiments, a method is provided for forming an ultra-shallow boron dopant region in a raised feature or in a recessed feature in a substrate.

DETAILED DESCRIPTION OF SEVERAL EMBODIMENTS

Figure 1A:
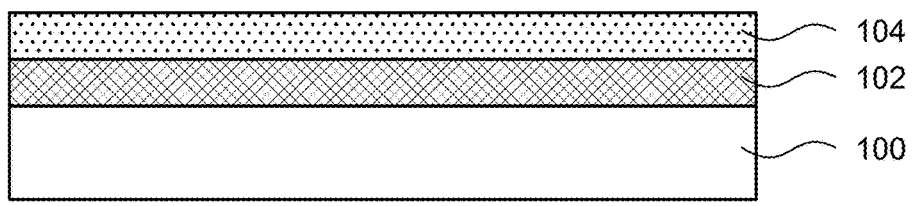
FIGS. 1A-1C show schematic cross-sectional views of a process flow for forming an ultra-shallow boron dopant region in a substrate according to an embodiment of the invention.

Methods for forming ultra-shallow boron dopant regions in semiconductor devices by solid phase diffusion from a boron dopant layer through a diffusion filter layer into a substrate layer are disclosed in various embodiments. The boron dopant regions can include, for example, ultra-shallow source-drain extensions for planar transistors, FinFETs, or tri-gate FETs. Other applications of ultra-shallow boron dopant region formation can include channel doping in replacement gate process flows, and for FinFET, or extremely thin silicon on insulator (ET-SOI) devices. Devices with extremely thin alternative semiconductor channels may also be doped using the disclosed method, for instance germanium on insulator devices (GeOI) or Ge FinFETs, and III-V channel devices such as GaAs, InGaAs, or InGaSb FinFETs. In addition, devices formed in amorphous Si or polycrystalline Si layers, such as EDRAM devices may utilize the disclosed method to adjust the Si doping level.

One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Furthermore, it is understood that the various embodiments shown in the drawings are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrase "in one embodiment" in various places throughout this specification are not necessarily referring to the same embodiment of the invention.

Previous work on boron doping by solid state diffusion includes the use of a $B_2O_3$ dopant layer as a source of boron dopants, where the $B_2O_3$ dopant layer is in direct contact with the substrate and boron atoms diffuse directly into the substrate from the $B_2O_3$ dopant layer during a heat-treating. The thickness, boron content, and boron depth profile of the resulting boron dopant region in the substrate is a function of the thickness of the $B_2O_3$ dopant layer and the heat-treating conditions, including substrate temperature and duration of the heat-treating. However, new methods are needed to better control the properties of the boron dopant region.

Embodiments of the invention provide a novel new approach to control the properties of the boron-doped region, including the junction depth. According to one embodiment, an inert and thermally stable diffusion filter layer containing boron nitride (BN) is positioned between the substrate and the boron dopant layer. According to other embodiments, the diffusion filter layer can contain a boron oxynitride layer, a silicon nitride layer, or a silicon oxynitride layer. The diffusion filter layer can act as a blocking layer to impede boron diffusion and control the properties of the boron doping region, including the thickness, boron content, and boron depth profile. In one example, the diffusion filter layer may be used to achieve less than boron saturation concentration in the boron doping region. For example, a thickness of the diffusion filter layer can be used to control the properties of the boron doping region. In one example, the diffusion filter layer can include a BN layer deposited by atomic layer deposition (ALD) and a $B_2O_3$ dopant layer can also be deposited by ALD. The use of ALD provides a method of manufacturing a boron-doped semiconductor device with excellent control over the thickness of the BN layer, the boron dopant layer, and the properties of the boron doping region.

According to one embodiment, a method is provided for forming an ultra-shallow boron doping region in a semiconductor device. The method includes depositing a diffusion filter layer on a substrate, the diffusion filter layer containing a boron nitride layer, a boron oxynitride layer, a silicon nitride layer, or a silicon oxynitride layer, and depositing a boron dopant layer on the diffusion filter layer, where the boron dopant layer contains boron oxide, boron oxynitride, or a combination thereof, with the proviso that the diffusion filter layer and the boron dopant layer do not contain the same material. The method further includes heat-treating the substrate to form the ultra-shallow boron dopant region in the substrate by controlled diffusion of boron from the boron dopant layer through the diffusion filter layer and into the substrate.

A significant drawback to using a pure $B_2O_3$ dopant layer is the extreme air instability of $B_2O_3$. This is due to its high reactivity with moisture in the ambient which results in boric acid formation that has a high vapor pressure. The inventors have realized that a cap layer may be formed on the $B_2O_3$ dopant layer to protect the $B_2O_3$ dopant layer from the moisture. According to one embodiment, the cap layer can contain or consist of BN. The use of the cap layer allows for heat-treating a substrate containing the $B_2O_3$ dopant layer in non-clustered thermal processing system.

According to one embodiment, the boron dopant layer can contain boron oxynitride (BNO). In some examples, a composition of the boron oxynitride can range from nitrogen-doped boron oxide with B and O as the major elements to an oxygen-doped boron nitride with B and N as the major elements. Increasing the nitrogen-content and reducing the oxygen-content in the BNO allows for further controlling the properties of the boron doping region since the presence of nitrogen increases the thermal stability of BNO relative to $B_2O_3$. In one embodiment, a cap layer may be formed on the BNO layer to protect the BNO layer from moisture.

Figure 1B:
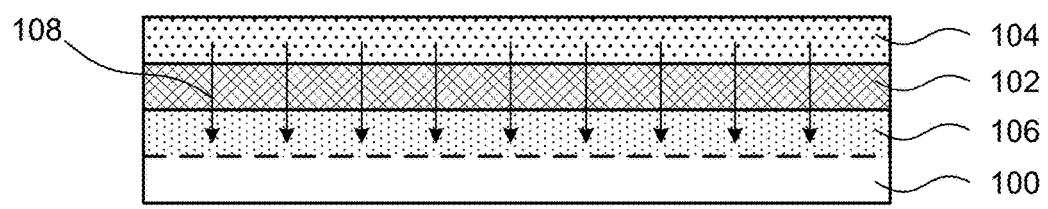
Figure 1C:
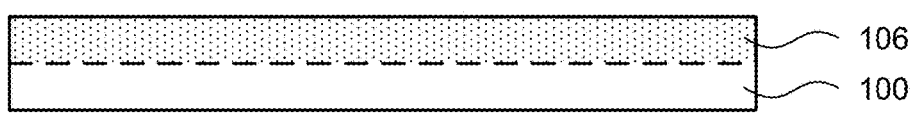

FIGS. 1A-1C show schematic cross-sectional views of a process flow for forming an ultra-shallow dopant region in a substrate according to an embodiment of the invention. FIG. 1A shows a schematic cross-sectional view of substrate 100, a diffusion filter layer 102 on the substrate 100, and a boron dopant layer 104 on the diffusion filter layer 102. The substrate 100 can be of any size, for example a 200 mm substrate, a 300 mm substrate, or an even larger substrate. According to one embodiment, the substrate 100 can contain Si, for example crystalline Si, polycrystalline Si, or amorphous Si. In one example, the substrate 100 can be a tensile-strained Si layer. According to another embodiment, the substrate 100 may contain Ge or $Si_xGe_{1-x}$ compounds, where x is the atomic fraction of Si, 1-x is the atomic fraction of Ge, and 0<x<1. Exemplary $Si_xGe_{1-x}$ compounds include $Si_{0.1}Ge_{0.9}$, $Si_{0.2}Ge_{0.8}$, $Si_{0.3}Ge_{0.7}$, $Si_{0.4}Ge_{0.6}$, $Si_{0.5}Ge_{0.5}$, $Si_{0.6}Ge_{0.4}$, $Si_{0.7}Ge_{0.3}$, $Si_{0.8}Ge_{0.2}$, and $Si_{0.9}Ge_{0.1}$. In one example, the substrate 100 can be a compressive-strained Ge layer or a tensile-strained $Si_xGe_{1-x}$ (x>0.5) deposited on a relaxed $Si_{0.5}Ge_{0.5}$ buffer layer. According to some embodiments, the substrate 100 can include a silicon-on-insulator (SOI). In some embodiments the substrate 100 can include a compound semiconductor, e.g., GaAs.

The diffusion filter layer 102 and the boron dopant layer 104 may be deposited by atomic layer deposition (ALD). In one example, a $B_2O_3$ dopant layer 104 may be deposited by ALD by a) providing a substrate in a process chamber configured for performing an ALD process, b) exposing the substrate to a vapor phase boron amide or an organoborane precursor, c) purging/evacuating the process chamber, d) exposing the substrate to a reactant gas containing $H_2O$, $O_2$, or $O_3$, a combination thereof, e) purging/evacuating the process chamber, and f) repeating steps b)-e) any number of times until the $B_2O_3$ dopant layer has a desired thickness. In another example, a BNO dopant layer 104 or a BNO diffusion filter layer 102 may be deposited by ALD using in step d) a reactant gas containing 1) $H_2O$, $O_2$, or $O_3$, and $NH_3$, or 2) NO, $NO_2$, or $N_2O$, and optionally one or more of $H_2O$, $O_2$, $O_3$, and $NH_3$. In one example, a BN diffusion filter layer 102 may be deposited by ALD using a reactant gas containing $NH_3$ in step d).

According to embodiments of the invention, the boron amide may be include a boron compound of the form $L_nB(NR^1R^2)_3$ where L is a neutral Lewis base, n is 0 or 1, and each of $R^1$ and $R^2$ may be selected from alkyls, aryls, fluoroalkyls, fluoroaryls, alkoxyalkyls, and aminoalkyls. Examples of boron amides include $B(NMe_2)_3$, $(Me_3)B(NMe_2)_3$, and $B[N(CF_3)_2]_3$. According to embodiments of the invention, the organoborane may include a boron compound of the form $L_nBR^1R^2R^3$ where L is a neutral Lewis base, n is 0 or 1, and each of $R^1$, $R^2$ and $R^3$ may be selected from alkyls, aryls, fluoroalkyls, fluoroaryls, alkoxyalkyls, and aminoalkyls. Examples of boron amides include $BMe_3$, $(Me_3N)BMe_3$, $B(CF_3)_3$, and $(Me_3N)B(C_6F_3)$.

According to some embodiments, a diffusion filter layer 102 containing a silicon nitride layer or a silicon oxynitride layer may be deposited or grown on the substrate 100 using methods well known to those skilled in the art.

In some examples, a thickness of each of the diffusion filter layer 102 and the boron dopant layer 104 can be 10 nanometers (nm), or less, or 4 nm or less, for example between 1 nm and 4 nm, between 2 nm and 4 nm, or between 3 nm and 4 nm. However, other thicknesses may be used.

The film structure in FIG. 1A may be heat-treated (annealed) to diffuse boron from the boron dopant layer 104 through the diffusion filter layer 102 and into the substrate 100. This is schematically shown in FIG. 1B where boron diffusion is represented by arrows 108. The heat-treating forms an ultra-shallow boron dopant region 106 in the substrate 100 underneath the diffusion filter layer 102. The heat-treating can include heating the substrate 100 in an inert atmosphere (e.g., argon (Ar) or nitrogen ($N_2$)) to a temperature between 100° C. and 1000° C. for between 10 seconds and 10 minutes. Some heat-treating examples include substrate temperatures between 100° C. and 500° C., between 200° C. and 500° C., between 300° C. and 500° C., and between 400° C. and 500° C. Other examples include substrate temperatures between 500° C. and 1000° C., between 600° C. and 1000° C., between 700° C. and 1000° C., between 800° C. and 1000° C., and between 900° C. and 1000° C. Still other examples include a substrate temperature greater than 800° C., a substrate temperature of 900° C., or greater than 900° C. In some examples, the heat-treating may include rapid thermal annealing (RTA), a spike anneal, or a laser spike anneal.

In some examples, a thickness of the ultra-shallow boron dopant region 106 can be between 1 nm and 10 nm or between 2 nm and 5 nm. However, those skilled in the art will readily realize that the lower boundary of the ultra-shallow boron dopant region 106 in the substrate 100 may not be abrupt but rather characterized by gradual decrease in dopant concentration.

Following the heat-treating and formation of the ultra-shallow boron dopant region 106, the boron dopant layer 104 and the diffusion filter layer 102 may be removed using a dry etching process or a wet etching process. The resulting structure is depicted in FIG. 1C. According to one embodiment, the structure depicted in FIG. 1C may be heat-treated a second time at a higher temperature to activate the boron dopants in the boron dopant region 106.

Figure 2:
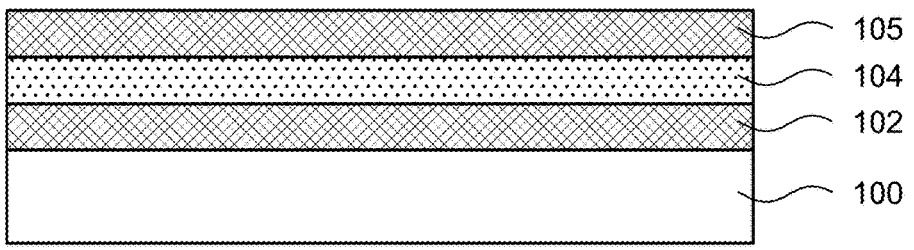
FIG. 2 show a schematic cross-sectional view of a film structure for forming an ultra-shallow boron dopant region in a substrate according to another embodiment of the invention.

According to another embodiment, as depicted in FIG. 2, a cap layer 105 may be deposited on the boron dopant layer 104 prior to the heat-treating. Following deposition of the cap layer 105, the film structure in FIG. 2 may be heat-treated as described in reference to FIGS. 1B-1C to form an ultra-shallow boron dopant region 106 in the substrate 100. In one example, the cap layer 105 can contain or consist of BN. In another example, the cap layer 105 may be an oxide layer, a nitride layer, or oxynitride layer, and can include Si and/or one or more of the high-k dielectric materials. The cap layer 105 may be deposited by chemical vapor deposition (CVD), or ALD, for example. In some examples, a thickness of the cap layer 105 can be between 1 nm and 100 nm, between 2 nm and 50 nm, or between 2 nm and 20 nm.

Figure 3A:
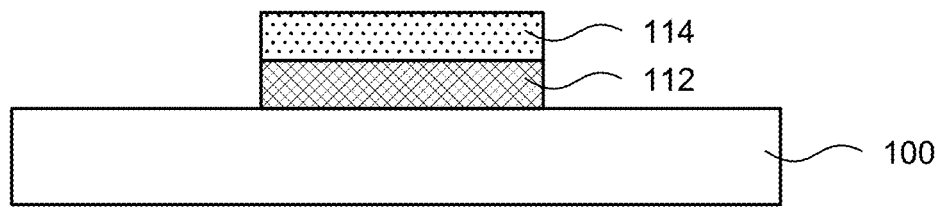
FIGS. 3A-3C show schematic cross-sectional views of a process flow for forming an ultra-shallow boron dopant region in a substrate according to yet another embodiment of the invention.
Figure 3B:
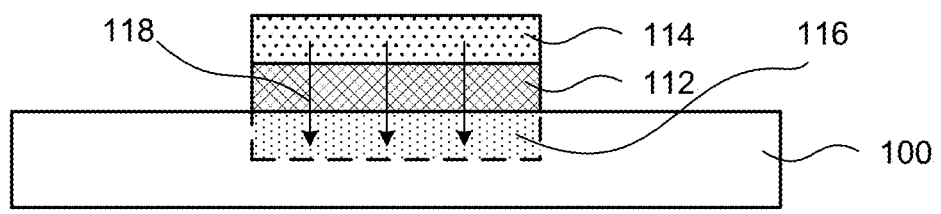
Figure 3C:
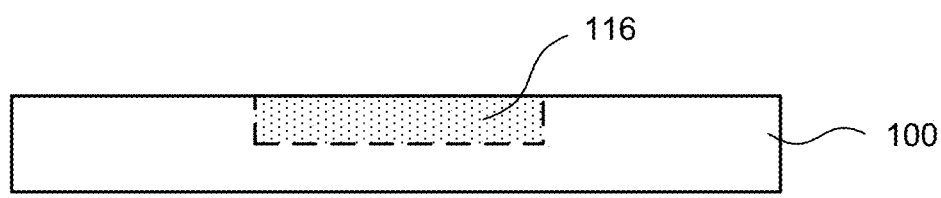

FIGS. 3A-3C show schematic cross-sectional views of a process flow for forming an ultra-shallow boron dopant region in a substrate according to yet another embodiment of the invention. The process flow is similar to the process flow in FIGS. 1A-1C but, as depicted in FIG. 3A, further includes forming a patterned diffusion filter layer 112 on the substrate 100, and a patterned boron dopant layer 114 on the patterned diffusion filter layer 112. For example, conventional photolithographic patterning and etching methods may be used to form the patterned diffusion filter layer 112 and the patterned boron dopant layer 114.

The film structure in FIG. 3A may be heat-treated (annealed) to diffuse boron from the patterned boron dopant layer 114 through the patterned diffusion filter layer 112 and into the substrate 100. This is schematically shown in FIG. 3B where boron diffusion is represented by arrows 118. The heat-treating forms an ultra-shallow boron dopant region 116 in the substrate 100 underneath the patterned diffusion filter layer 112.

Following the heat-treating and formation of the ultra-shallow boron dopant region 116, the patterned boron dopant layer 114 and the patterned diffusion filter layer 112 may be removed using a dry etching process or a wet etching process. The resulting structure is depicted in FIG. 3C.

Figure 4:
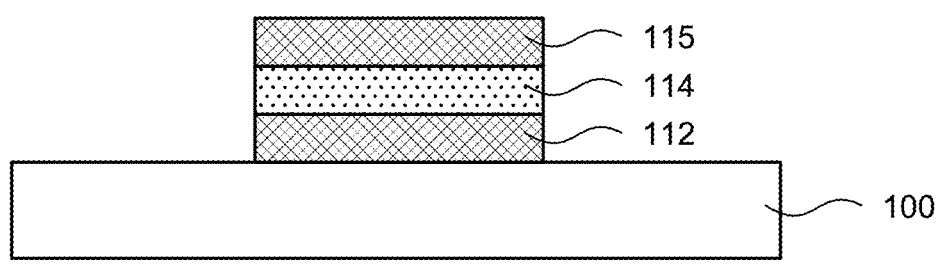
FIG. 4 show a schematic cross-sectional view of a film structure for forming an ultra-shallow boron dopant region in a substrate according to another embodiment of the invention.

According to another embodiment, as depicted in FIG. 4, a patterned cap layer 115 may be formed on the patterned boron dopant layer 114 prior to the heat-treating. Following formation of the patterned cap layer 115, the film structure in FIG. 4 may be heat-treated as described in reference to FIGS. 1B-1C to form an ultra-shallow boron dopant region 116 in the substrate 100.

According to another embodiment, the patterned cap layer 115 in FIG. 4 may be replaced by a blanked (not patterned) cap layer that is deposited on the patterned boron dopant layer 114 and on the substrate 100 adjacent the patterned diffusion filter layer 112.

According to another embodiment, the patterned diffusion filter layer 112 in FIG. 3A may be replaced by a blanked diffusion filter layer.

Figure 5:
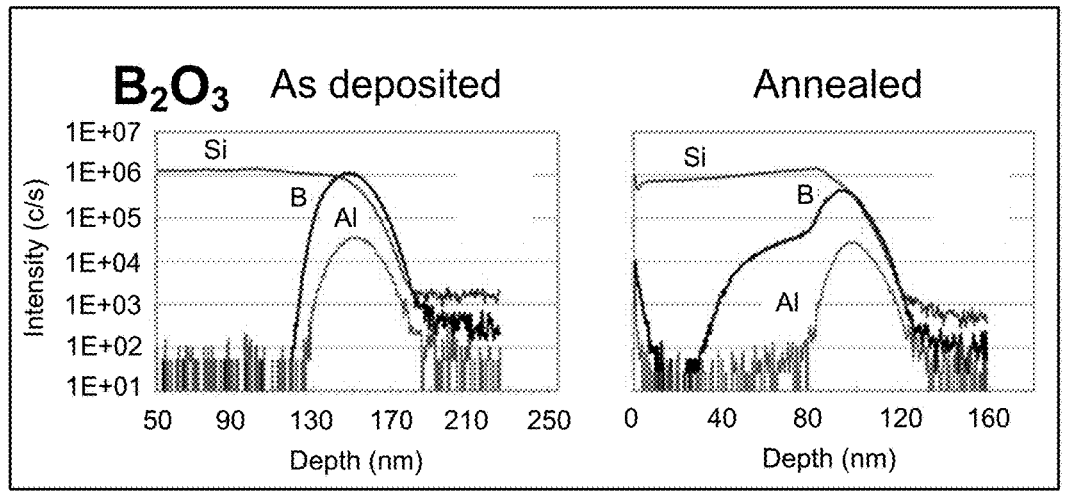
FIG. 5 shows a boron dopant depth profile for an as-deposited and a heat-treated (annealed) film structure containing $Al_2O_3/B_2O_3/Si$ layers.

According to one embodiment of the invention, two or more of diffusion filter layer, the boron dopant layer, and the cap layer may be deposited in a single process chamber. This prevents exposure of these layers to ambient moisture and other oxidizing gases in air. In one example, ALD of these layers may be achieved during sequential processing in the process chamber where a boron nitride layer is deposited using alternating gaseous exposures of a boron amide or an organoboron precursor and a first reactant gas (e.g., $NH_3$), thereafter a boron oxide layer is deposited using alternating gaseous exposures of a boron amide or an organoboron precursor and a second reactant gas (e.g., $H_2O$, $O_2$, or $O_3$, or a combination of two or more thereof), and thereafter a boron nitride cap layer is deposited using alternating gaseous exposures of a boron amide or an organoboron precursor and a third reactant gas (e.g., $NH_3$ for a boron nitride layer). In one example, the boron oxide layer may be replaced by a boron oxynitride layer that is deposited using alternating gaseous exposures of a boron amide or an organoboron precursor and a fourth reactant gas (e.g., a) $H_2O$, $O_2$, or $O_3$, and $NH_3$, or b) NO, $NO_2$, or $N_2O$, and optionally one or more of $H_2O$, $O_2$, $O_3$, and $NH_3$. According to one embodiment, the diffusion filter layer and the boron dopant layer may be deposited in the same process chamber, where the substrate is maintained at the same substrate temperature during deposition of the diffusion filter layer and the boron dopant layer FIG. 5 shows a boron dopant depth profile for an as-deposited and a heat-treated (annealed) film structure containing $Al_2O_3/B_2O_3$/Si layers. The depth profile plot was obtained using backside SIMS and further shows depth profiles for Si and Al. The $B_2O_3$ and $Al_2O_3$ layers were deposited by ALD in the same process chamber, where the $B_2O_3$ layers were deposited using 60 ALD cycles. The film structure was heat-treated (annealed) at 1000° C. for 30 seconds in a $N_2$ atmosphere.

Figure 6:
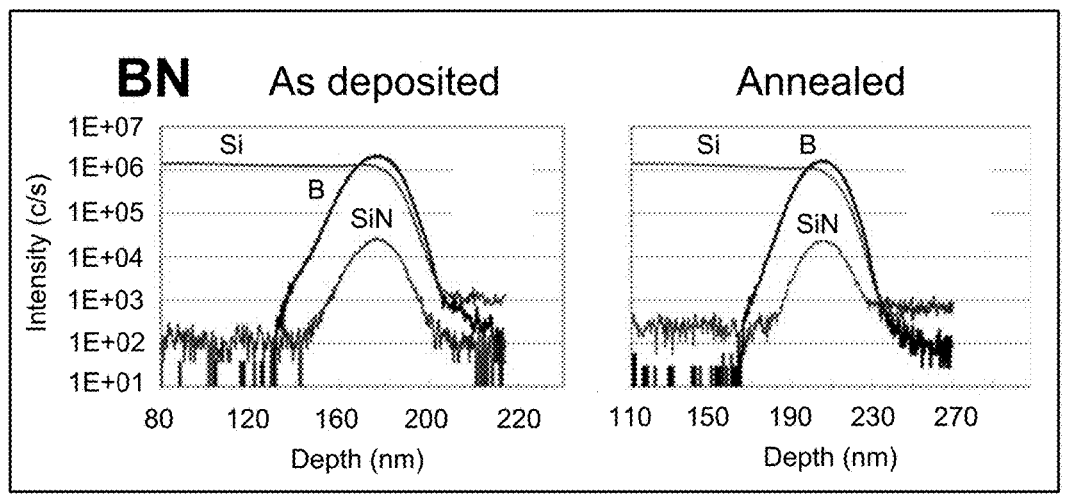
FIG. 6 shows a boron dopant depth profile for an as-deposited and a heat-treated (annealed) film structure containing SiN/BN/Si layers.

FIG. 6 shows a boron dopant depth profile for an as-deposited and a heat-treated (annealed) film structure containing SiN/BN/Si layers. The depth profile plot was obtained using backside SIMS and further shows depth profiles for Si and SiN. The BN and SiN layers were deposited by ALD, where the BN layers were deposited using 40 ALD cycles. The film structure was heat-treated (annealed) at 1000° C. for 30 seconds in a $N_2$ atmosphere.

The SIMS depth profiles in FIGS. 5 and 6 demonstrate that boron diffuses very easily from a $B_2O_3$ layer into a Si substrate during a heat-treating at 1000° C. but, for comparison, BN is a very inert and stable material in contact with Si. This can be explained, at least in part, that BN is more refractory than $B_2O_3$ and the melting point for BN is 2966° C. but only 450° C. for $B_2O_3$. Embodiments of the invention utilize this property to use BN as a diffusion filter layer to impede and control the boron diffusion from a boron dopant layer through the diffusion filter layer and into a Si substrate. Thus, the boron diffusion may be controlled by tailoring the thickness of the diffusion filter layer.

Figures 7, 8:
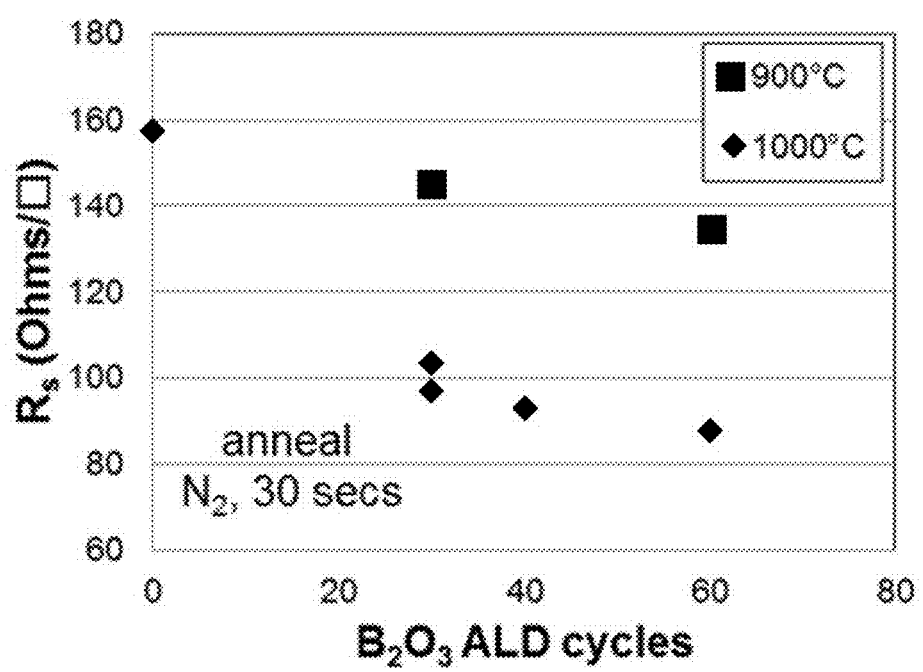
FIG. 7 shows normalized Rs results for heat-treated $B_2O_3$ and BN layers on Si substrates.
FIG. 8 shows Rs results for heat-treated $B_2O_3$ layers on Si substrates.

FIG. 7 shows normalized Rs results for heat-treated $B_2O_3$ and BN layers on Si substrates. The film structures contained cap layer/$B_2O_3$/Si and cap layer/BN/Si that were heat-treated at 1000° C. for 30 seconds in a $N_2$ atmosphere. The normalized sheet resistance (Rs) results show that boron diffuses very easily from a $B_2O_3$ layer into a Si substrate during a heat-treatment at 1000° C. In contrast, BN is a very inert and stable material in contact with Si.

FIG. 8 shows Rs results for heat-treated $B_2O_3$ layers on Si substrates. The $B_2O_3$ layers were deposited using 30, 40, and 60 ALD cycles, and thereafter, heat-treated at 900° C. or 1000° C. for 30 seconds in a $N_2$ atmosphere. The $B_2O_3$ layer deposition and the heat-treating were performed in a clustered wafer processing tool without exposure to air. The Rs results show that boron diffusion into the Si substrate increases with increased heat-treating temperature and increased $B_2O_3$ layer thickness.

Figure 9:
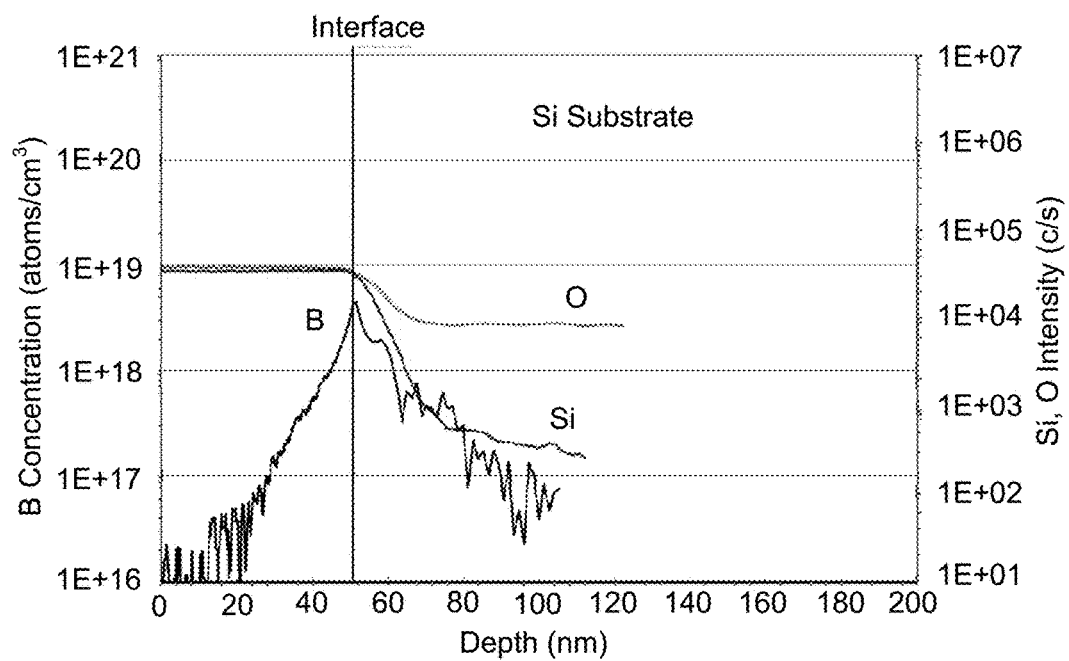
FIGS. 9-11 compare boron dopant depth profiles for heat-treated (annealed) samples containing $B_2O_3$/Si layers to a depth profile for a Si substrate.
Figure 10:
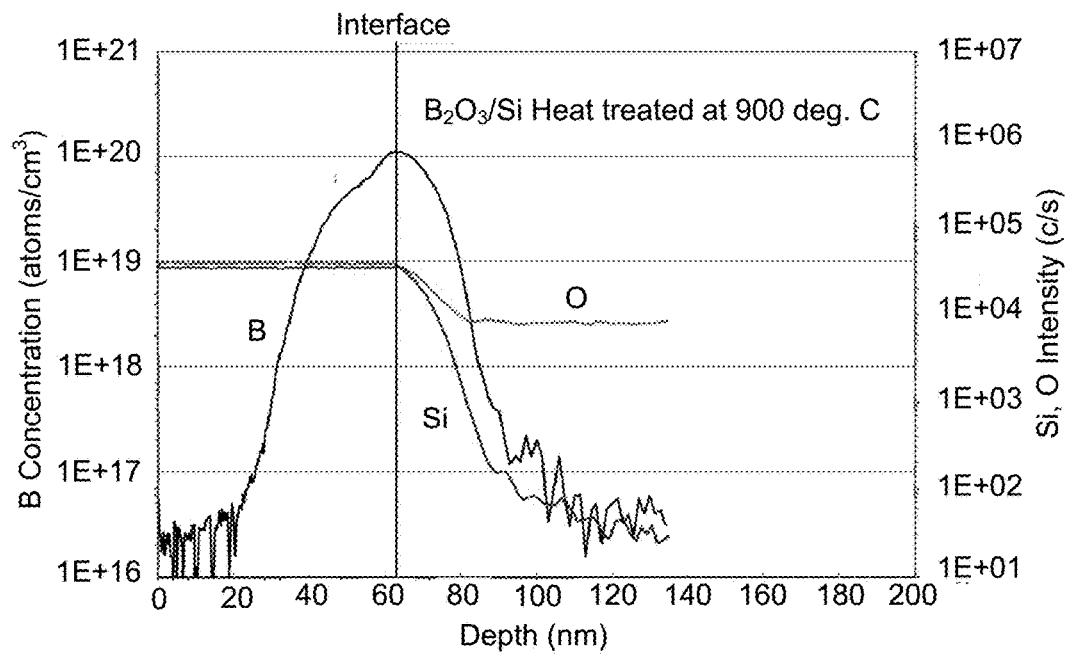
Figure 11:
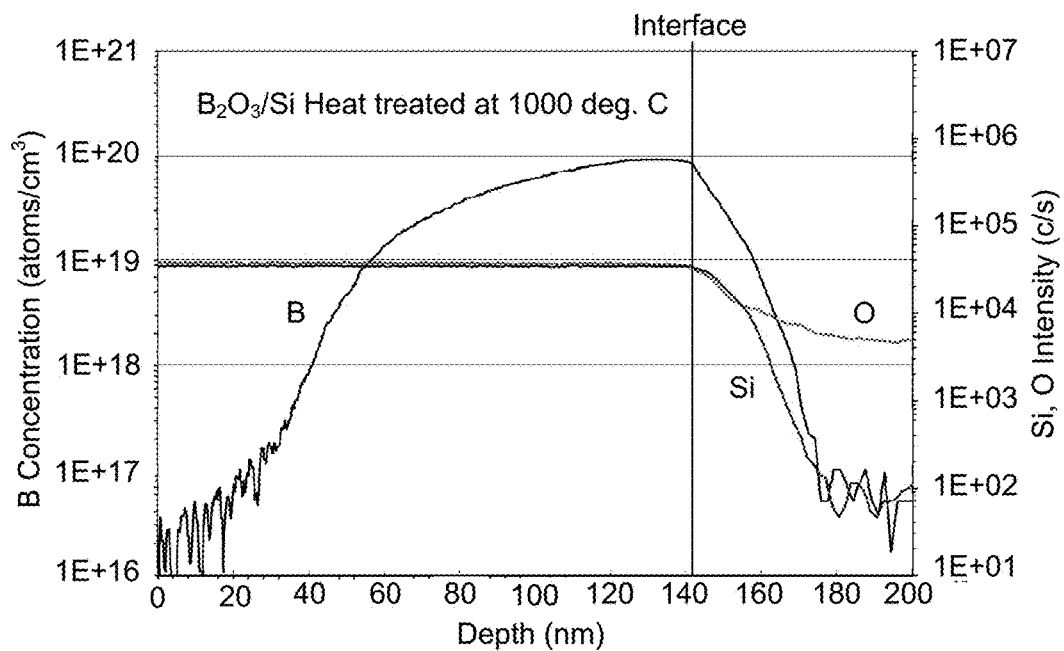
Figure 12:
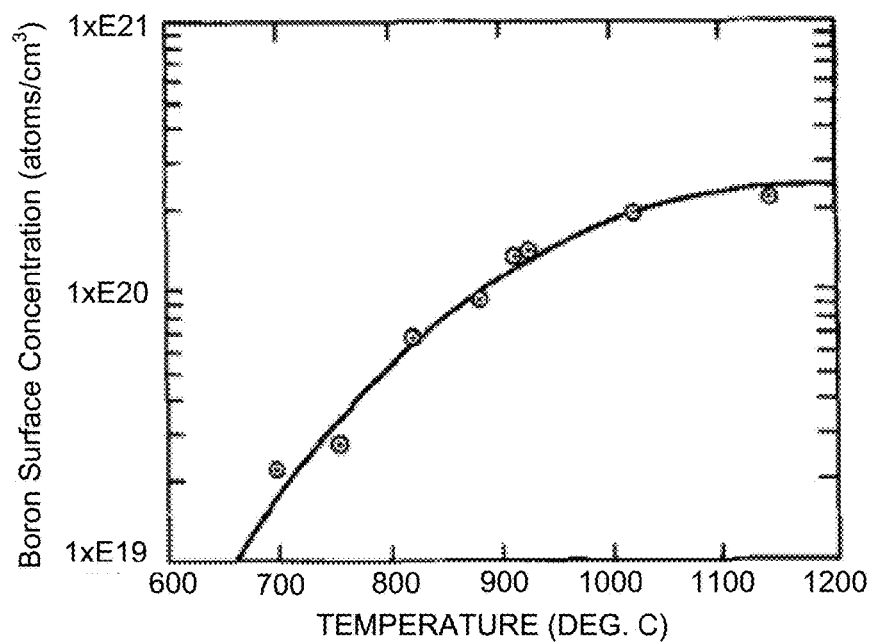
FIG. 12 shows boron solid solubility as a function of temperature.

FIGS. 9-11 compare boron dopant depth profiles for heat-treated (annealed) samples containing $B_2O_3$/Si layers to a depth profile for a Si substrate. The $B_2O_3$ layers were deposited using 60 ALD cycles and then heat-treated at 900° C. (FIGS. 10) and 1000° C. (FIG. 11) and the depth profiles compared to a Si substrate (FIG. 9). The SIMS results show that the boron diffuses deeper into the Si substrate with increasing heat-treating temperature. The boron concentration near the $B_2O_3$/Si interface is about 1E+20 atoms/$cm^3$, which is near the boron solid solubility shown in FIG. 12 (adapted from Vick and Whittle, J. Electrochem. Soc. 116, 1142 (1969)).

A plurality of embodiments for forming ultra-shallow boron dopant region in a substrate by solid phase diffusion of boron from a boron dopant layer through a diffusion filter layer into the substrate have been disclosed in various embodiments. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method of forming an ultra-shallow boron doping region in a semiconductor device, the method comprising:
    depositing a diffusion filter layer on a substrate, the diffusion filter layer containing a boron nitride layer, a boron oxynitride layer, a silicon nitride layer, or a silicon oxynitride layer;
    depositing a boron dopant layer on the diffusion filter layer, the boron dopant layer containing boron oxide, boron oxynitride, or a combination thereof, with the proviso that the diffusion filter layer and the boron dopant layer do not contain the same material; and
    heat-treating the substrate to form the ultra-shallow boron dopant region in the substrate by controlled diffusion of boron from the boron dopant layer through the diffusion filter layer and into the substrate, wherein the diffusion filter layer, the boron dopant layer, or both the diffusion filter layer and the boron dopant layer, are deposited by atomic layer deposition (ALD) using alternating gaseous exposures of a boron amide precursor and a reactant gas.

2. The method of claim 1, further comprising
prior to the heat-treating, depositing a cap layer on the boron dopant layer.

3. The method of claim 2, wherein the cap layer contains a boron nitride layer.

4. The method of claim 1, further comprising
removing the diffusion filter layer and the boron dopant layer from the substrate.

5. The method of claim 1, wherein the heat-treating is performed in an inert atmosphere.

6. The method of claim 1, wherein the substrate contains a raised feature or a recessed feature, and the diffusion filter layer and the boron dopant layer are conformally deposited on the raised feature or in the recessed feature.

7. The method of claim 1, wherein the boron dopant layer contains boron oxide and the reactant gas includes $H_2O$, $O_2$, or $O_3$, or a combination of two or more thereof.

8. The method of claim 1, wherein the boron dopant layer contains boron oxynitride and the reactant gas includes a) $H_2O$, $O_2$, or $O_3$, and $NH_3$, or b) NO, $NO_2$, or $N_2O$, and optionally one or more of $H_2O$, $O_2$, $O_3$, and $NH_3$.

9. The method of claim 1, wherein the diffusion filter layer is deposited using alternating gaseous exposures of the boron amide precursor and the reactant gas containing $NH_3$.

10. The method of claim 1, wherein the diffusion filter layer and the boron dopant layer are deposited in the same process chamber, and wherein the substrate is maintained at the same substrate temperature during deposition of the diffusion filter layer and the boron dopant layer.

11. A method of forming an ultra-shallow boron doping region in a semiconductor device, the method comprising:
depositing a diffusion filter layer on a substrate, the diffusion filter layer containing a boron nitride layer, a boron oxynitride layer, a silicon nitride layer, or a silicon oxynitride layer;
depositing a boron dopant layer on the diffusion filter layer, the boron dopant layer containing boron oxide, boron oxynitride, or a combination thereof, with the proviso that the diffusion filter layer and the boron dopant layer do not contain the same material; and
heat-treating the substrate to form the ultra-shallow boron dopant region in the substrate by controlled diffusion of boron from the boron dopant layer through the diffusion filter layer and into the substrate, wherein the diffusion filter layer, the boron dopant layer, or both the diffusion filter layer and the boron dopant layer, are deposited by atomic layer deposition (ALD) using alternating gaseous exposures of an organoboron precursor and a reactant gas.

12. The method of claim 11, wherein the boron dopant layer contains boron oxide and the reactant gas includes $H_2O$, $O_2$, or $O_3$, or a combination of two or more thereof.

13. The method of claim 11, wherein the boron dopant layer contains boron oxynitride and the reactant gas includes a) $H_2O$, $O_2$, or $O_3$, and $NH_3$, or b) NO, $NO_2$, or $N_2O$, and optionally one or more of $H_2O$, $O_2$, $O_3$, and $NH_3$.

14. The method of claim 11, wherein the diffusion filter layer is deposited using alternating gaseous exposures of the organoboron precursor and the reactant gas containing $NH_3$.

15. The method of claim 11, further comprising
prior to the heat-treating, depositing a cap layer on the boron dopant layer.

16. The method of claim 11, further comprising
removing the diffusion filter layer and the boron dopant layer from the substrate.

17. The method of claim 11, wherein the heat-treating is performed in an inert atmosphere.

18. The method of claim 11, wherein the substrate contains a raised feature or a recessed feature, and the diffusion filter layer and the boron dopant layer are conformally deposited on the raised feature or in the recessed feature.

19. A method of forming an ultra-shallow boron doping region in a semiconductor device, the method comprising:
depositing a diffusion filter layer on a substrate, the diffusion filter layer containing a boron nitride layer;
depositing a boron dopant layer on the diffusion filter layer, the boron dopant layer containing boron oxide or boron oxynitride;
depositing a cap layer on the boron dopant layer;
heat-treating the substrate in an inert atmosphere to form the ultra-shallow boron dopant region in the substrate by controlled diffusion of boron from the boron dopant layer through the diffusion filter layer and into the substrate; and
removing the diffusion filter layer and the boron dopant layer from the substrate.

20. The method of claim 15, wherein the cap layer contains a boron nitride layer.

* * * * *